United States Patent
Huang et al.

(10) Patent No.: US 7,217,984 B2
(45) Date of Patent: May 15, 2007

(54) DIVIDED DRAIN IMPLANT FOR IMPROVED CMOS ESD PERFORMANCE

(75) Inventors: Shao-Chang Huang, Hsinchu (TW); Yu-Hung Chu, Hsin chu County (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 0 days.

(21) Appl. No.: 11/156,063

(22) Filed: Jun. 17, 2005

(65) Prior Publication Data

US 2006/0284258 A1 Dec. 21, 2006

(51) Int. Cl.
*H01L 21/8234* (2006.01)
*H01L 21/8238* (2006.01)

(52) U.S. Cl. .............. 257/452; 257/357; 257/356; 257/355; 257/173

(58) Field of Classification Search ............ 257/173, 257/355, 356, 357, 452, E21.618, E21.633
See application file for complete search history.

(56) References Cited

U.S. PATENT DOCUMENTS

| | | | | |
|---|---|---|---|---|
| 5,963,409 A | * | 10/1999 | Chang | 361/56 |
| 6,306,695 B1 | * | 10/2001 | Lee et al. | 438/152 |
| 6,329,235 B1 | * | 12/2001 | Kuo | 438/238 |
| 6,878,996 B2 | * | 4/2005 | Rothleitner | 257/341 |
| 6,998,685 B2 | * | 2/2006 | Manna et al. | 257/357 |
| 7,071,528 B2 | * | 7/2006 | Ker et al. | 257/492 |

\* cited by examiner

*Primary Examiner*—Evan Pert
*Assistant Examiner*—Victor A. Mandala, Jr.
(74) *Attorney, Agent, or Firm*—K & L Gates LLP (57) ABSTRACT

A divided drain implant structure for transistors used for electrostatic discharge protection is disclosed. At least two transistors are formed close to each other on a substrate with their gates and sources coupled together and with the drains placed next to each other and separated as a divided drain implant structure. The divided drain implant structure further comprises at least two drain implant regions separated by a lightly doped drain region and a halo implant region formed underneath. At least one of the drain implant regions is coupled to an input/output pad of a circuit.

17 Claims, 10 Drawing Sheets

DIVIDED DRAIN IMPLANT FOR IMPROVED CMOS ESD PERFORMANCE

BACKGROUND

The present invention relates generally to the fabrication of complementary metal-oxide-semiconductor integrated circuits (ICs), and more particularly to the implementation of divided drain implants to enhance IC electrostatic discharge protection while simplifying the IC fabrication process.

As device dimensions continue to be reduced, susceptibility to electrostatic discharge (ESD) damage is a growing concern. ESD events occur when a charge is transferred between one or more pins of an integrated circuit (IC) and another conducting object in a short period of time, typically less than one microsecond. The rapid charge transfer generates voltages large enough to breakdown insulating films, such as silicon dioxide, and to cause permanent damage to the device. To deal with the problem of ESD events, IC manufacturers have designed various structures on the input and output pads of their devices to shunt ESD currents away from sensitive internal structures. However, these additional ESD protection structures typically require additional masks and processes to implement into the IC, which increases the fabrication process time and cost.

Therefore, desirable in the art of CMOS IC ESD protection designs are improved ESD protection structures that can be implemented on both N type and P type CMOS devices without additional masks to minimize the IC fabrication process time and costs while increasing CMOS IC ESD protection.

SUMMARY

In view of the foregoing, this invention provides device structures and fabrication methods to improve CMOS IC ESD protection through the incorporation of a divided drain implant.

In one embodiment, at least two transistors are formed close to each other on a substrate with their gates and sources coupled together and with the drains placed next to each other and separated as a divided drain implant structure. The divided drain implant structure further comprises at least two drain implant regions separated by a lightly doped drain region and a halo implant region formed underneath. At least one of the drain implant regions is coupled to an input/output pad of a circuit.

The construction and method of operation of the invention, however, together with additional objects and advantages thereof will be best understood from the following description of specific embodiments when read in connection with the accompanying drawings.

DESCRIPTION

The following provides a detailed description of improved ESD protection structures that can be implemented on both N type and P type CMOS devices without additional masks, thereby minimizing the IC fabrication process time and costs while increasing CMOS IC ESD protection.

Figure 1A:
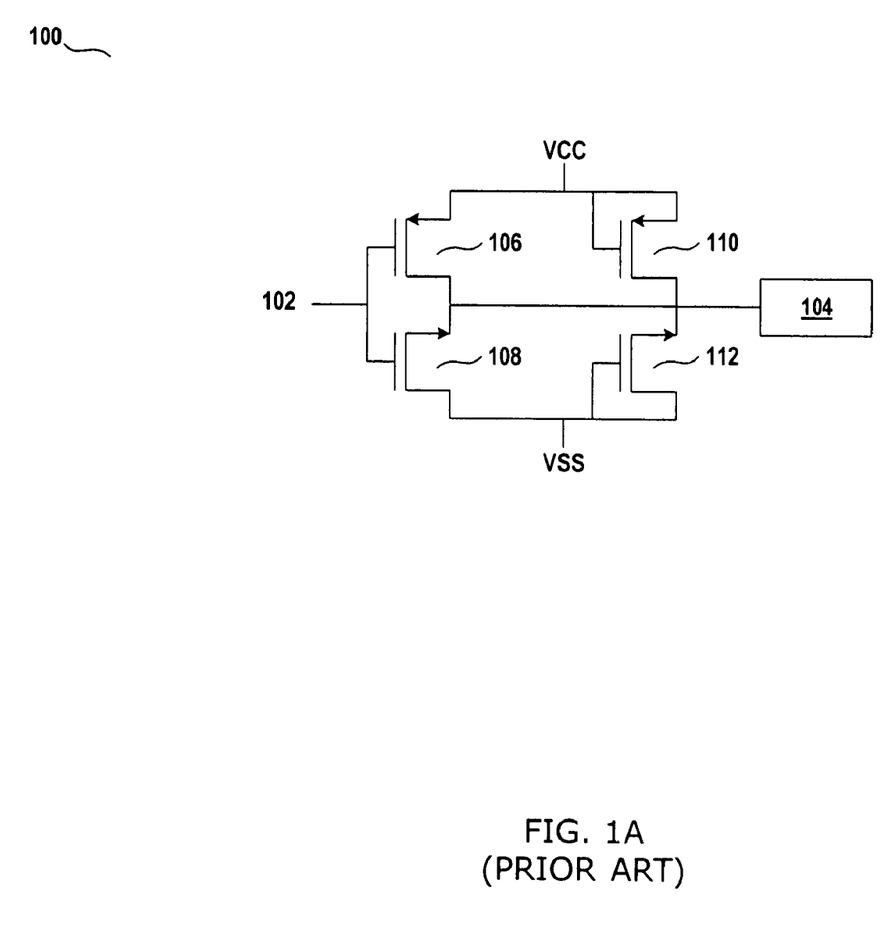
FIG. 1A presents a schematic of a conventional CMOS inverter output stage.

FIG. 1A presents a schematic of a conventional CMOS output circuit 100. In this output circuit 100, an input signal 102 is propagated to an output pad 104. A PMOS transistor 106 and a NMOS transistor 108 form an inverting driver stage whose output is tied directly to the output pad 104. In addition, a dummy stage comprising a PMOS ESD protection transistor 110 and a NMOS ESD protection transistor 112 acts as ESD protection devices for the output circuit 100. The ESD protection transistors 110 and 112 are not active in normal operation of the output circuit 100.

During an ESD event, a large voltage spike may occur on the output pad 104. A voltage pulse of about several kilovolts may occur for approximately a microsecond. If an ESD voltage spike occurs at the output pad 104, then either the PMOS ESD protection transistor 110 or the NMOS ESD protection transistor 112 will shunt the ESD current to either VCC (supply voltage) or VSS (ground) thus protecting the components of the output circuit 100.

Figure 1B:
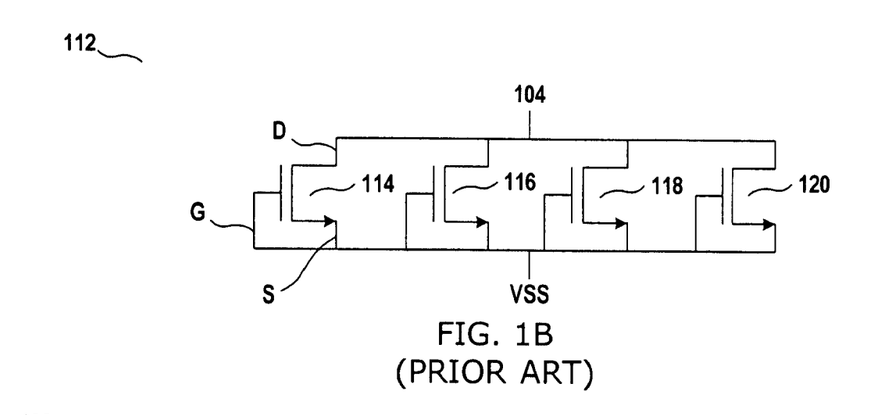
FIG. 1B presents a schematic of a conventional NMOS ESD protection transistor.

FIG. 1B presents a schematic of the internal design of a conventional NMOS ESD protection transistor 112. The NMOS ESD protection transistor 112 comprises four integrated parallel transistor devices 114, 116, 118, and 120 connected in a grounded gate circuit configuration. The gate and source of each of the transistors 114, 116, 118, and 120 are tied to VSS, while the drain of each of the transistors is connected to the output pad 104 by metallization layers within the IC (not shown).

Figure 1C:
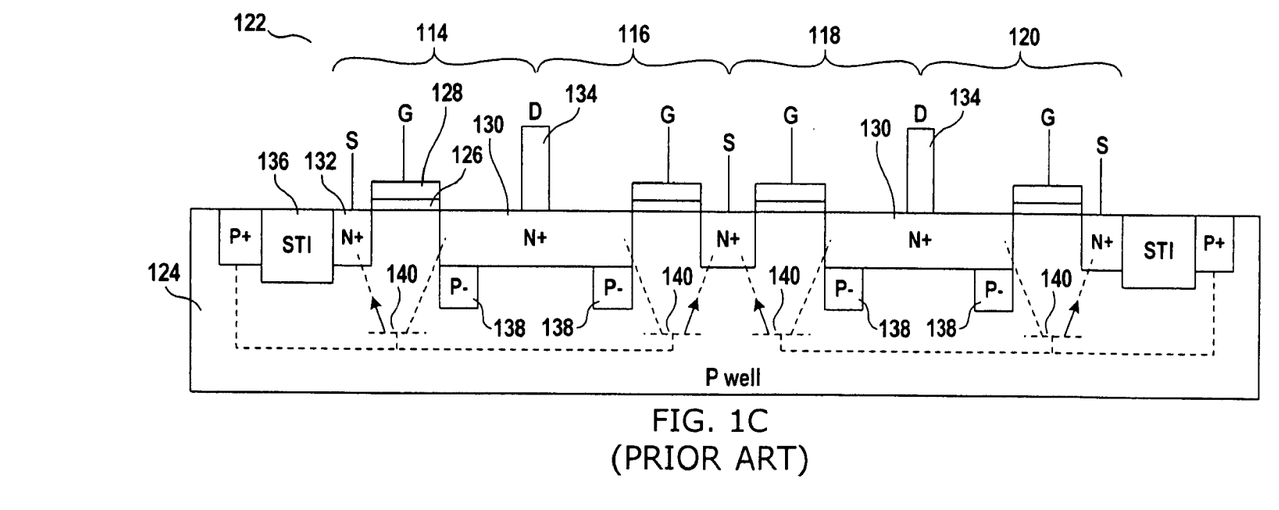
FIG. 1C presents a cross sectional view of a conventional IC structure for the NMOS ESD protection transistor shown in FIG. 1B.

FIG. 1C presents a cross sectional view 122 of the conventional NMOS ESD protection transistor 112 having the integrated, parallel NMOS transistors 114, 116, 118, and 120. Multiple paralleled transistors are used to increase the ESD current capability. Each of the four NMOS transistors are implanted into a P-well 124. The transistor 112 further includes a gate oxide layer 126, a polysilicon gate 128, N+ implanted drain, source areas 130 and 132, and metal drain contact areas 134. The transistors are isolated from other circuitry by a shallow trench isolation (STI) structure 136. The polysilicon gate 128 overlies the P-well 124 to form a channel region between the N+ drain area 130 and the N+ source area 132 for each transistor.

These implanted P– regions 138 have a higher doping concentration than the surrounding areas of the P-well 124. Therefore, the implanted P– regions 138 create a sharper p-n junction gradient that would exist between the N+ drain area 130 and the P-well 124. The sharper p-n junction gradient decreases the reverse breakdown voltage (Vbd) of the junction. Therefore, the junction begins conducting current into the substrate at a lower reverse voltage during an ESD event. In addition, the sharper p-n junction gradient increases the junction capacitance (Cj). Transient energy from the ESD event is propagated into the P-well 124 current due to junction capacitance as given by:

$$I_{p-well} = Cj \times dV/dt.$$

Therefore, the P-well 124 current increases as the junction capacitance increases. The implanted P– region 138 below the N+ drain area 130 form a parasitic npn transistor 140 in the P-well 124 area. The N+ drain area 130 and implanted P– region 138 form the N+ P– collector-base junction, while the implanted P– region 138 and the N+ source area 132 form the P-N base-emitter junction. This combination of decreased breakdown voltage and increased junction capacitance, due to the presence of the p– implanted regions 138, causes the parasitic npn transistor 140 to turn on faster to discharge the ESD current more quickly. All four NMOS transistors 114, 116, 118, and 120 operate identically.

The combination of decreased breakdown voltage and increased junction capacitance, due to the presence of the implanted P– regions 138, causes the parasitic npn transistor 140 to turn on faster to discharge the ESD current more quickly, thus providing better ESD protection to the output circuit 100.

Note that various P– regions 138 are implanted only under the N+ drain areas 130 of all four NMOS transistors 114, 116, 118, and 120. These implanted P– regions 138 require at least one separate mask and an additional implant process step, thereby increasing fabrication costs and processing time.

Figure 1D:
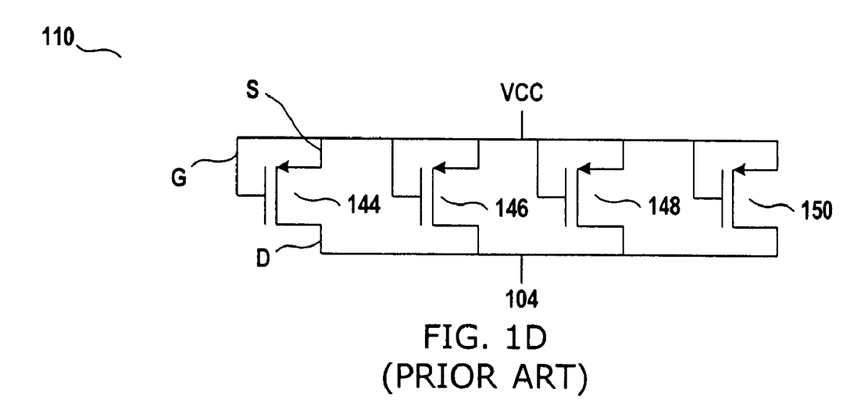
FIG. 1D presents a schematic of a conventional PMOS ESD protection transistor.

FIG. 1D presents a schematic of the internal design of the conventional PMOS ESD protection transistor 110 used as an ESD protection device. Multiple paralleled transistors are used to increase the ESD current capability. The PMOS ESD protection transistor 110 comprises four integrated parallel transistor devices 144, 146, 148, and 150. The gate and source of each of the transistors 144, 146, 148, and 150 are tied to VCC, while the drain of each of the transistors is connected to the output pad 104 by metallization layers within the IC (not shown).

Figure 1E:
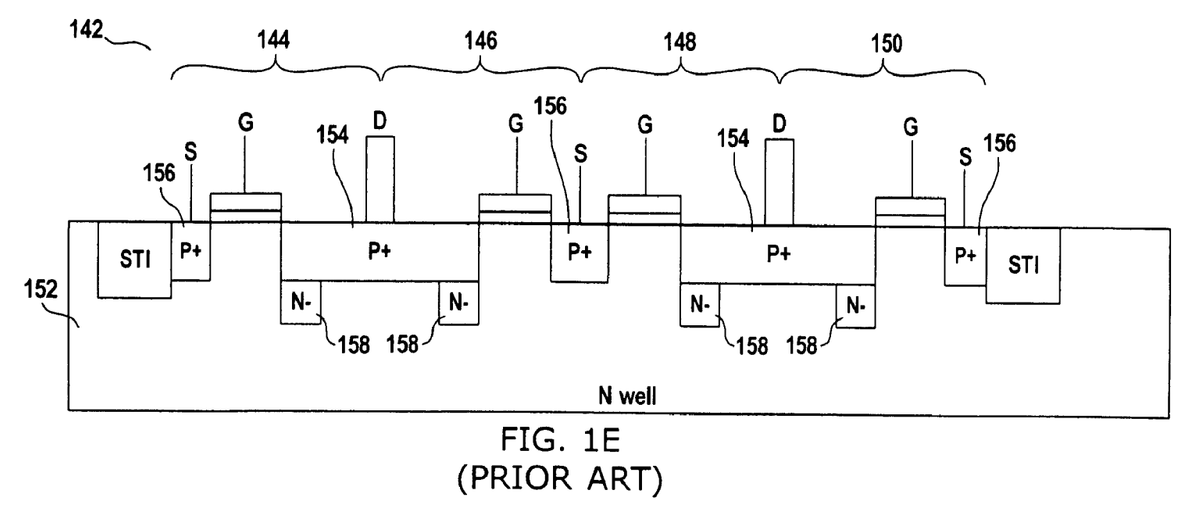
FIG. 1E presents a cross sectional view of a conventional IC structure for the PMOS ESD protection transistor shown in FIG. 1D.

FIG. 1E presents a cross sectional view of a conventional IC structure 142 for the PMOS ESD protection transistor 110 having the four integrated, parallel PMOS transistors 144, 146, 148, and 150 implanted into a N-well 152. A drain area 154 and a source area 156 of the PMOS transistors are implanted with P+ dopant. N– regions 158 are further implanted below the drain areas 154. The addition of N– regions 158 in the N-well 152 requires at least one separate mask and an additional implant process step, thereby increasing fabrication costs and processing time.

Figure 2:
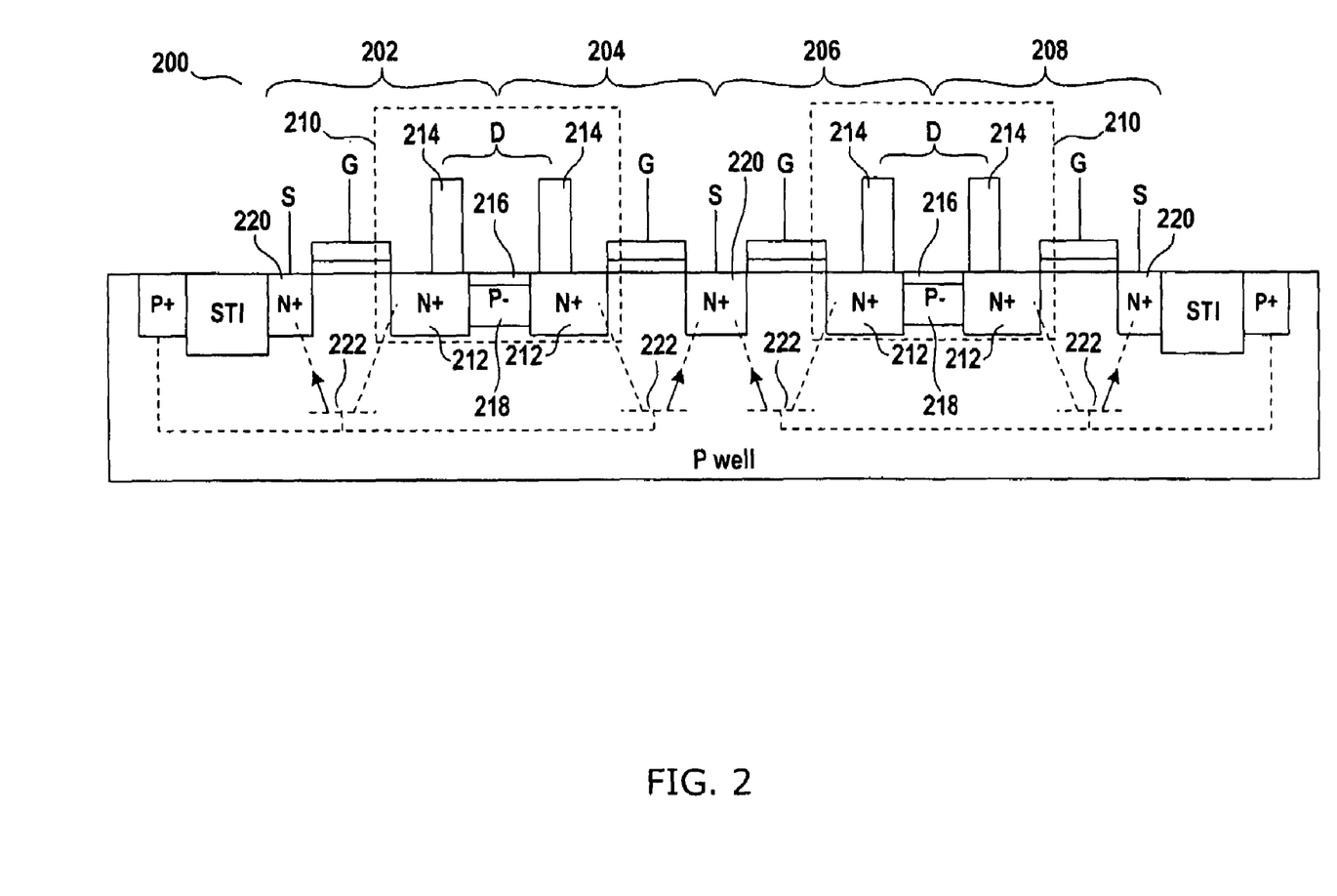
FIG. 2 presents a cross sectional view of a NMOS ESD protection transistor that incorporates a divided drain implant that creates two drain segments with two drain contacts in accordance with a first embodiment of the present invention.

FIG. 2 presents a cross sectional view of a NMOS ESD protection transistor 200 that incorporates a divided drain implant structure which creates two drain segments with two drain contacts in accordance with a first embodiment of the present invention. The NMOS ESD protection transistor 200 comprises four integrated parallel NMOS transistors 202, 204, 206, and 208. A divided drain implant structure 210 in this embodiment modifies the conventional single N+ drain structure 130 as presented in FIG. 1C into two N+ drain implant regions 212. This embodiment also creates two metal drain contacts 214 for connection to an input/output pad (not shown).

The divided drain implant structure 210 is created by first implanting a lightly doped drain (LDD) structure 216 in the drain substrate area. The LDD structure 216 is formed by the reduced doping of the drain region and is designed to control drain-substrate breakdown. The reduced doping gradient between the drain and channel lowers the electric field in the channel in the vicinity of the drain. It is typically implemented by deposition of a moderate N– implant before spacer formation and a heavy implant after spacer formation.

A P– implant 218 (also called "halo") is then formed beneath the LDD structure 216. Gate spacers (not shown) are formed on the sidewalls of the gates followed by deposition of the N+ drain implant regions 212 and N+ source structures 220. This fabrication process creates the divided drain implant structure 210, which contains the two N+ drain implant regions 212 divided by the LDD structure 216 and the P– halo implant 218. FIG. 3 presents a fabrication process of the divided drain implant structure 210.

The new divided drain implant structure 210 fabrication process forms a parasitic npn transistor 222 that operates similarly to the parasitic npn transistor 140 formed by the conventional fabrication process defined in FIG. 1C. With an ESD voltage spike applied to the output pad and the metal drain contacts 214 connected to the output pad (not shown), the ESD current will propagate into the P-well via the npn parasitic transistor 222. With the N+ source structure 220 tied to VSS, the ESD current will be shunted through the parasitic transistor 222 to VSS and will protect the output circuit 100.

This embodiment eliminates the need for the additional fabrication mask necessary to implant the P– region required by the conventional fabrication process presented in FIG. 1C. The LDD mask can be used for the P– region. The new P– halo implant region 218, formed by the divided drain structure 210, simplifies the fabrication process and reduces fabrication costs while increasing ESD protection.

FIGS. 3A–3D present a series of cross sections 302, 304, 306 and 308 depicting the new CMOS IC divided drain implant fabrication process in accordance with the first embodiment of the present invention.

Figure 3A:
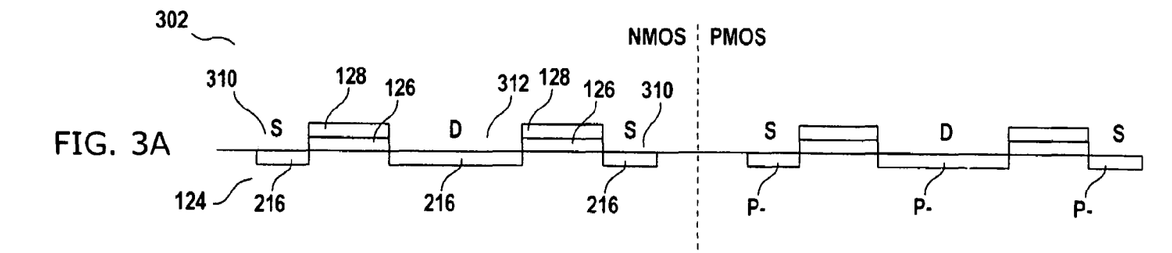
FIGS. 3A–3D present a series of cross sections depicting the new CMOS IC divided drain implant fabrication process in accordance with the first embodiment of the present invention.

As shown in FIG. 3A, the fabrication process begins with a LDD implant process step. At this point, the gate oxide layer 126 and the polysilicon gate 128 are already deposited on the P-well 124. The LDD structure 216 is created by implanting a lightly doped N– implant within source areas 310 and a drain area 312. The LDD structure 216 is designed to control drain-substrate breakdown.

Figure 3B:
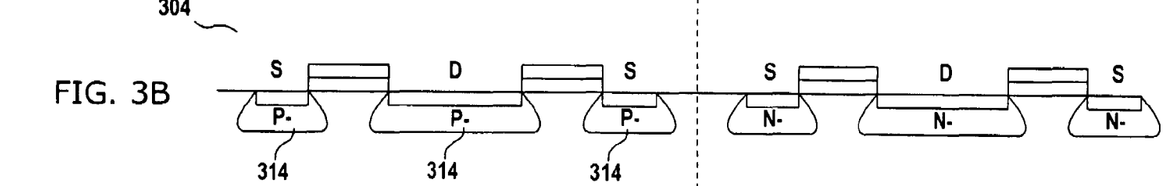

As shown in FIG. 3B, the fabrication process continues with a deposition of P– implant areas 314 deep into the P-well 124. Note that the deposition of the P– implant areas 314 does not require a separate dedicated fabrication mask, but rather utilizes the conventional LDD fabrication mask.

Figure 3C:
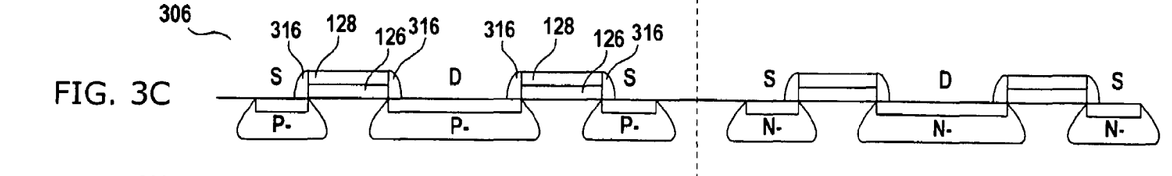
Figure 3D:
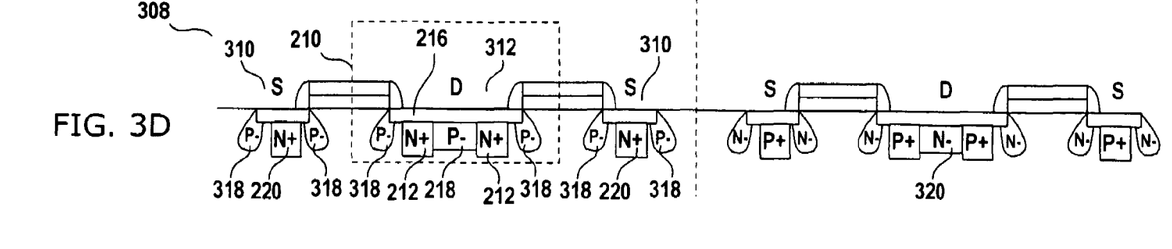

As shown in FIG. 3C, the fabrication process continues with the deposition of gate spacers 316 for protecting the sides of the polysilicon gate 128 and the gate oxide layer 126 from subsequent processes. As shown in FIG. 3D, the fabrication process concludes with the formation of the divided drain implant structure 210, which further includes the deposition of a heavy doped N+ implant in the source areas 310 and drain areas 312 to create the N+ source structure 220 and the divided N+ drain structures 212. The P− implant areas 314 where the N+ source structure 220 and the N+ drain structure 212 now reside are deleted due to the subsequent heavy N+ doping to create the source and drain. The only P− implant 314 areas to remain are LDD areas 318 on either side of the divided drain structure 210 (or the "pockets") that wrap around the corners of the LDD regions and protect the LDD regions from punch through, and the P− halo implant 218 between the N+ drain structures 212. The P− halo implant 218 will remain at about at least 0.5 µm in thickness.

As further shown in FIG. 3, PMOS devices are fabrication using similar processes, except that opposite material types are used. The creation of the P− implant 218 for NMOS devices and a N− implant 320 for PMOS devices without an additional mask, as required in conventional fabrication processes, is the main improvement of this invention.

Figure 4:
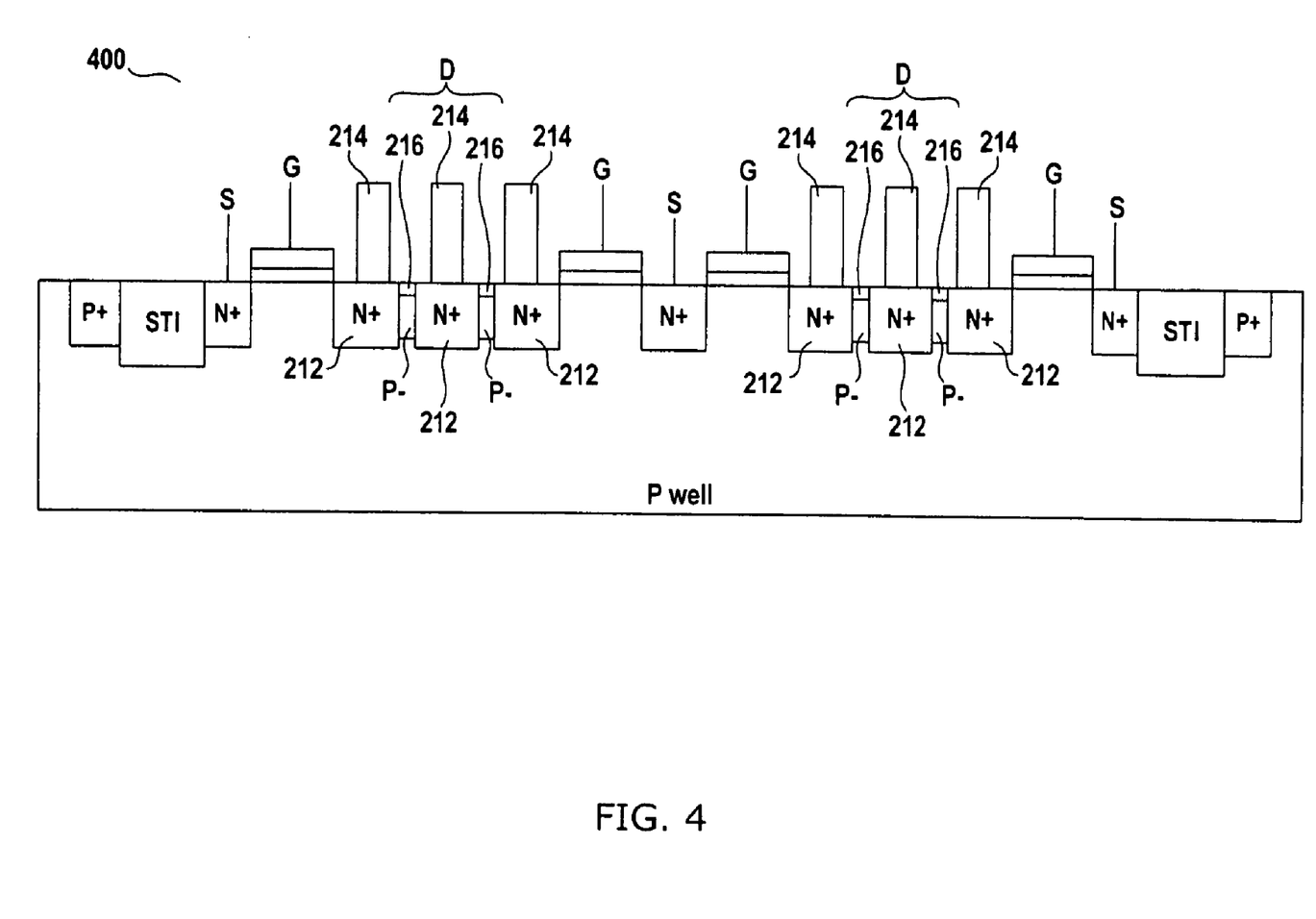
FIG. 4 presents a cross sectional view of a NMOS ESD protection transistor with three drain segments and three drain contacts in accordance with a second embodiment of the present invention.

FIG. 4 presents a cross sectional view of a NMOS ESD protection transistor 400 with three drain structures 212 and three drain contacts 214 in accordance with a second embodiment of the present invention. The fabrication process is identical to that presented in FIG. 3, except that the fabrication mask to create the three drain structures 212 is changed. In this embodiment, the LDD structure 216, hence the drain structure, is expanded to form more N+P− junctions. The longer drain structure increases the drain resistance, which improves its ESD performance.

Figure 5:
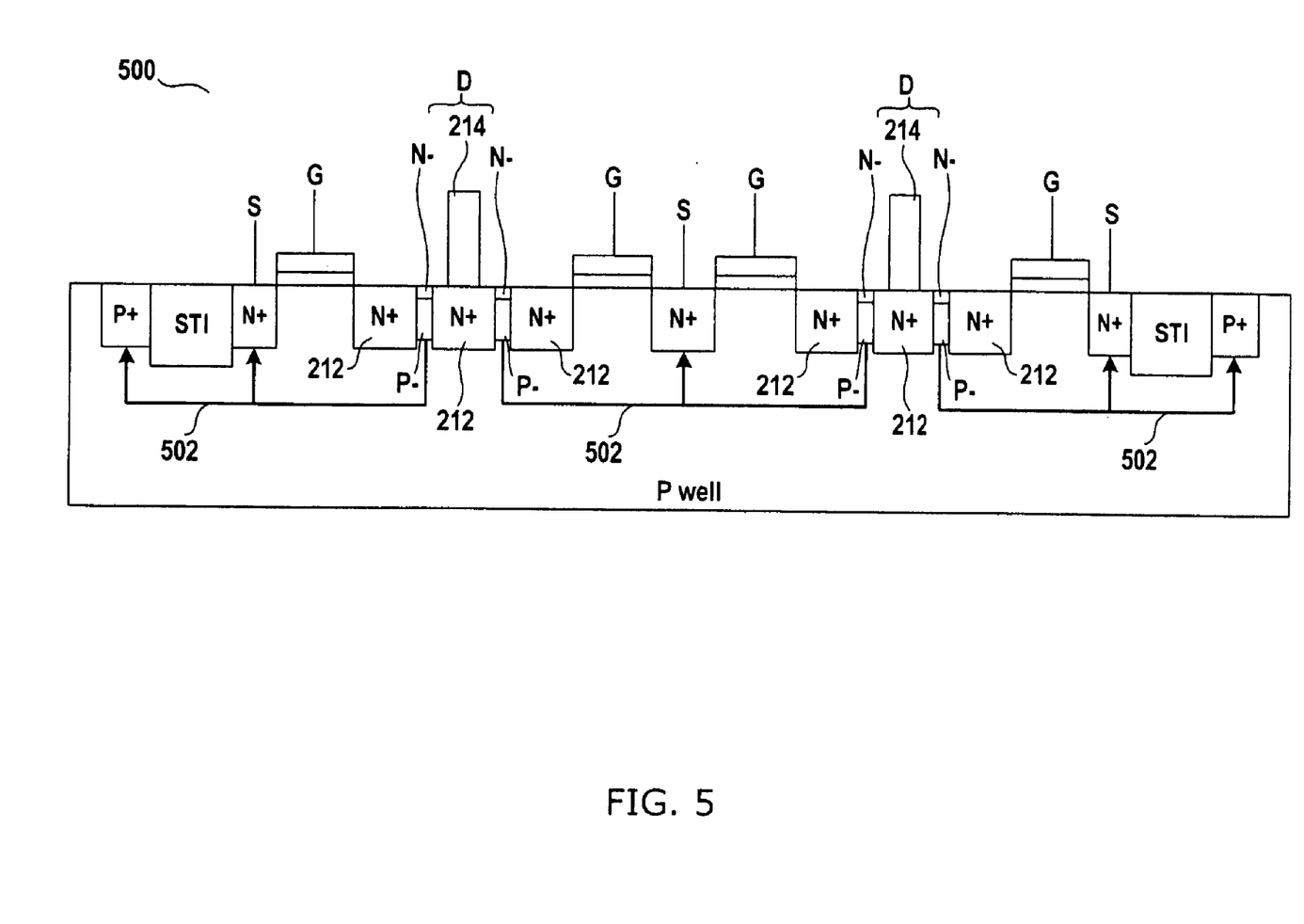
FIG. 5 presents a cross sectional view of a NMOS ESD protection transistor with three drain segments and one drain contact in accordance with a third embodiment of the present invention.

FIG. 5 presents a cross sectional view of a NMOS ESD protection transistor 500 with three drain structures 212 and one drain contact 214 in accordance with a third embodiment of the present invention. In this embodiment, only one drain contact 214 is provided so that the large ESD current can only propagate through the parasitic npn transistor (not shown) via current paths 502 in the P-well and not through the MOS transistor channel to avoid potential damage to the MOS transistor device during an ESD event.

Figure 6:
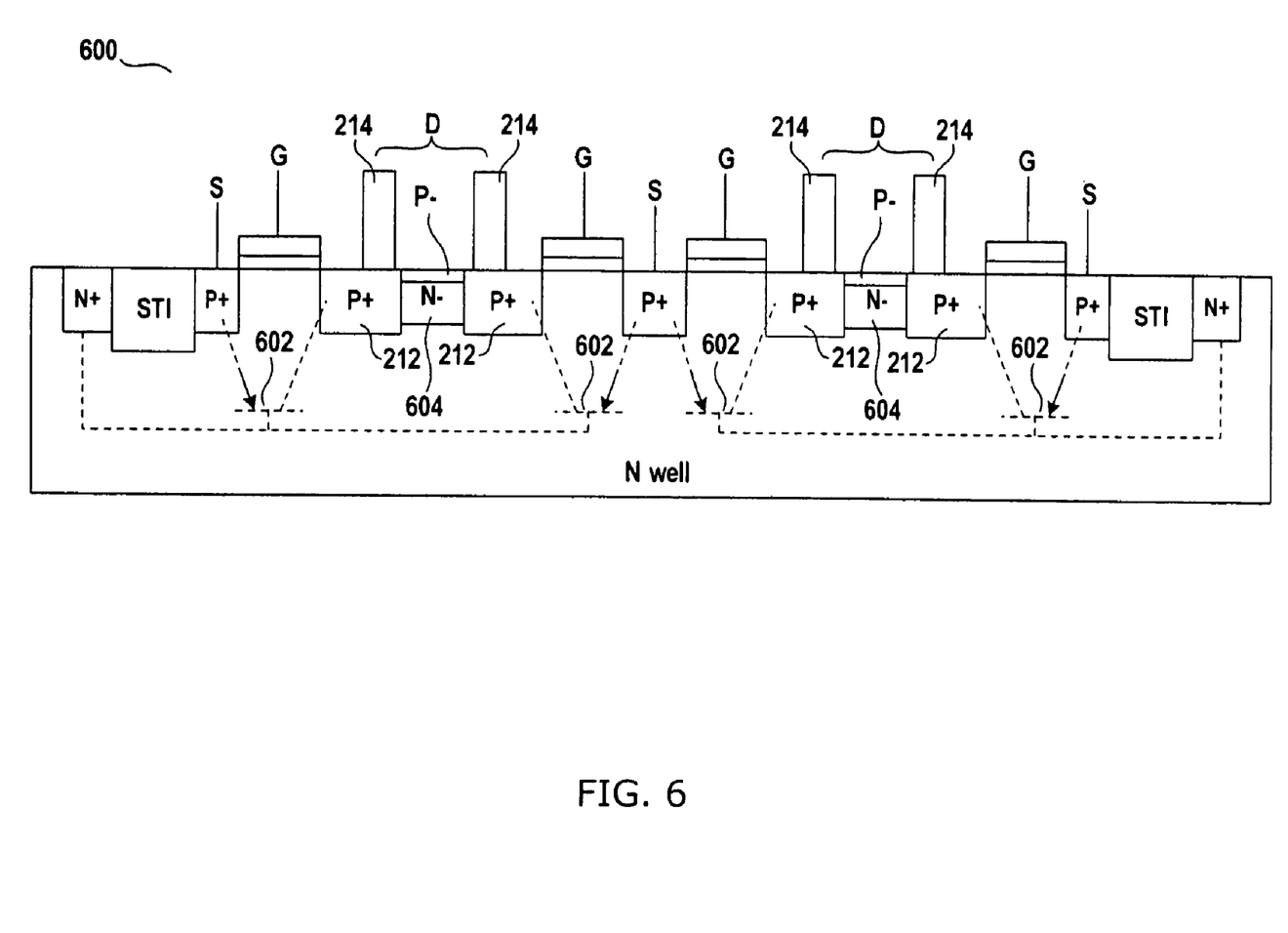
FIG. 6 presents a cross sectional view of a PMOS ESD protection transistor with two drain segments and two drain contacts in accordance with a fourth embodiment of the present invention.

FIG. 6 presents a cross sectional view of a PMOS ESD protection transistor 600 with two drain structures 212 and two drain contacts 214 in accordance with a fourth embodiment of the present invention. In this embodiment, a pnp parasitic transistor 602 is formed in the N-well to discharge the ESD current. The divided drain implant fabrication process is identical to the NMOS fabrication process.

Similar to the operation of the NMOS ESD protection transistor, the combination of decreased breakdown voltage and increased junction capacitance, due to the presence of N− implanted regions 604, causes the parasitic pnp transistor 602 in the N-well to turn on faster to discharge the ESD current more quickly, thus providing better ESD protection.

Figure 7:
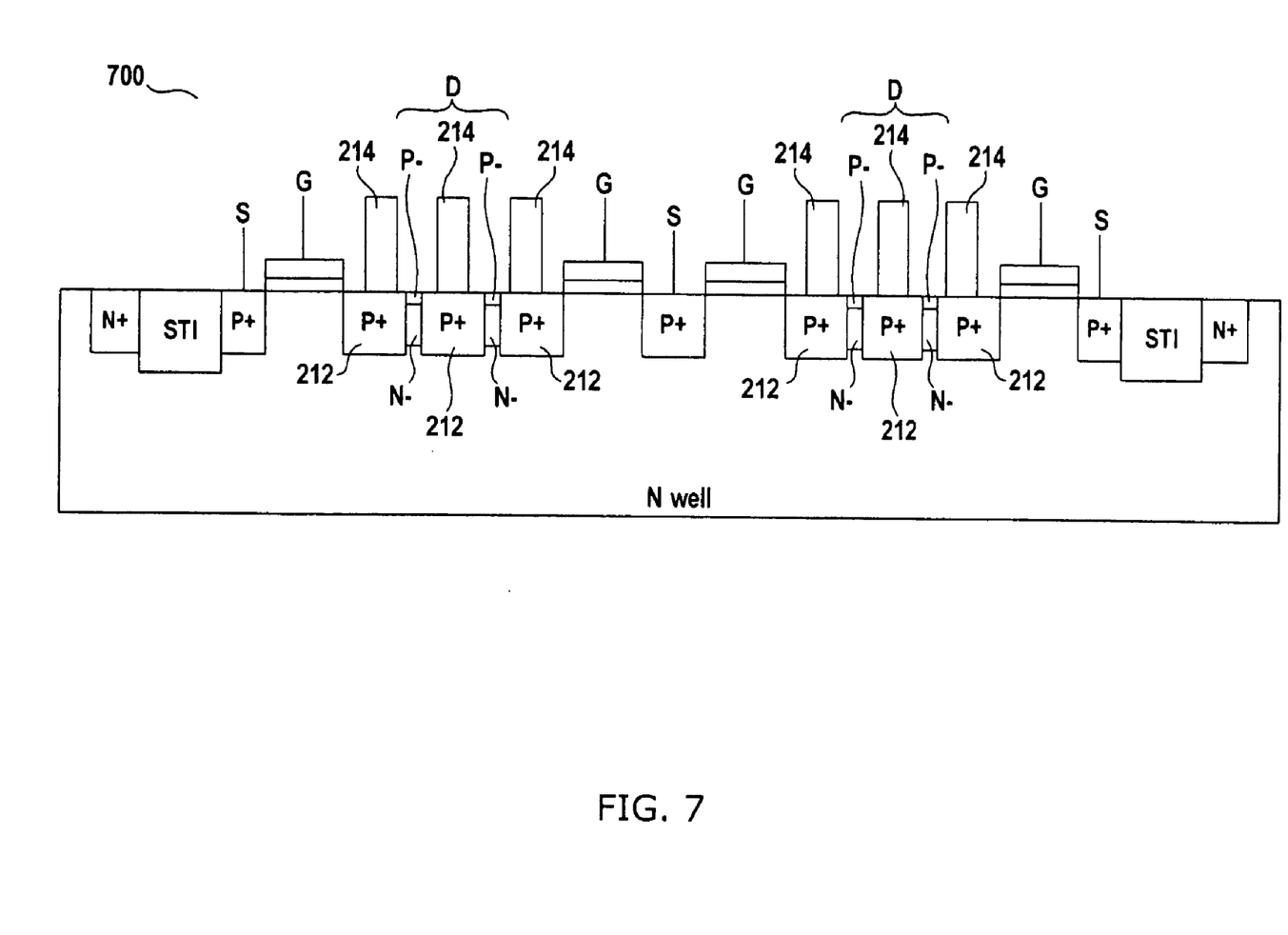
FIG. 7 presents a cross sectional view of a PMOS ESD protection transistor with three drain segments and three drain contacts in accordance with a fifth embodiment of the present invention.

FIG. 7 presents a cross sectional view of a PMOS ESD protection transistor 700 with three drain structures 212 and three drain contacts 214 in accordance with a fifth embodiment of the present invention. In this embodiment, the drain structure is expanded to form more P+/N− junctions. The longer drain structure increases the drain resistance, which improves its ESD performance.

Figure 8:
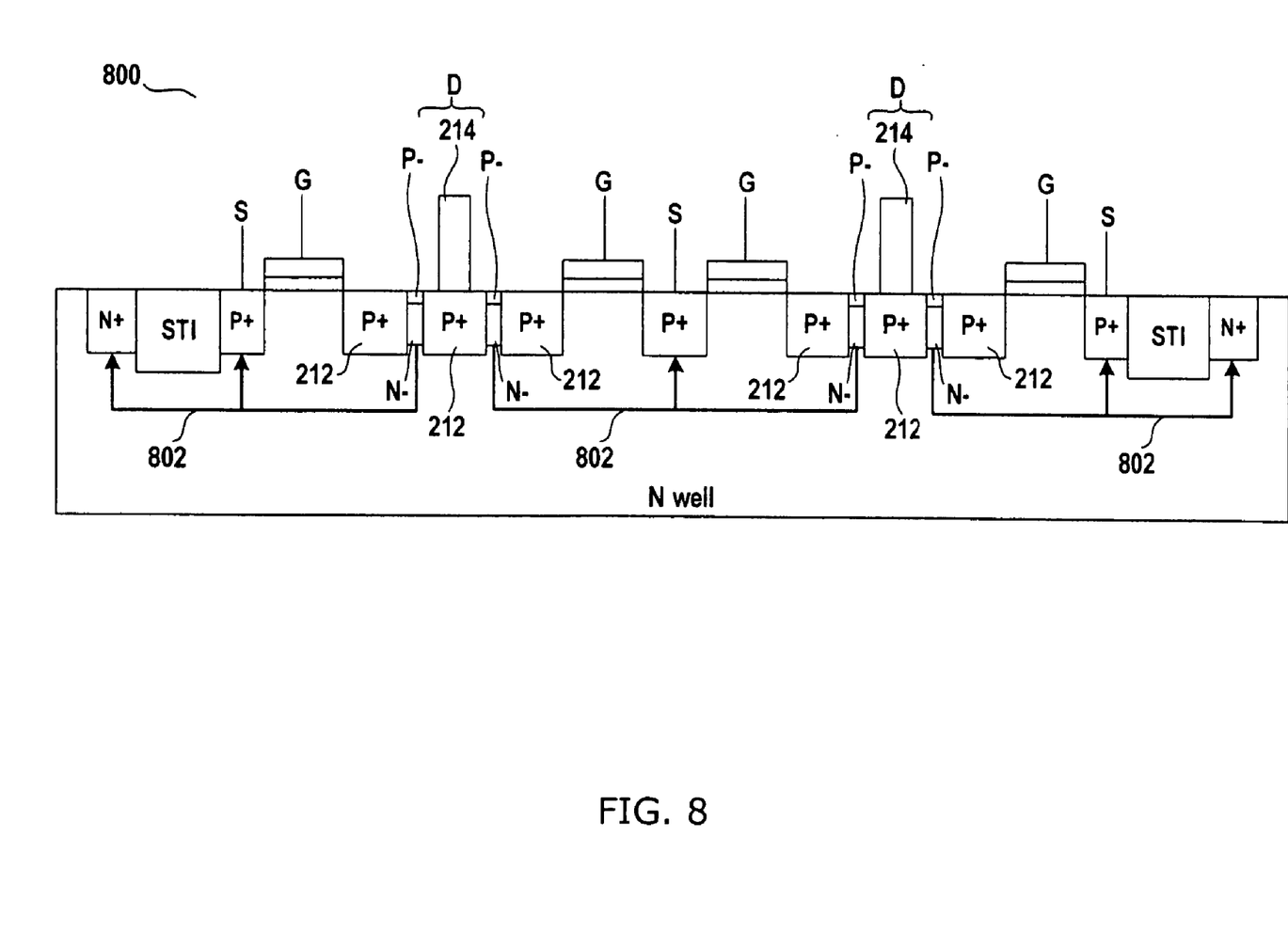
FIG. 8 presents a cross sectional view of a PMOS ESD protection transistor with three drain segments and one drain contact in accordance with a sixth embodiment of the present invention.

FIG. 8 presents a cross sectional view of a PMOS ESD protection transistor 800 with three drain structures 212 and one drain contact 214 in accordance with a sixth embodiment of the present invention. In this embodiment, only one drain contact 214 is provided so that the large ESD current can only propagate through the parasitic pnp transistor (not shown) via current paths 802 in the N-well and not through the MOS transistor channel to avoid potential damage to the MOS transistor device during an ESD event.

The above illustration provides many different embodiments or embodiments for implementing different features of the invention. Specific embodiments of components and processes are described to help clarify the invention. These are, of course, merely embodiments and are not intended to limit the invention from that described in the claims.

Although the invention is illustrated and described herein as embodied in one or more specific examples, it is nevertheless not intended to be limited to the details shown, since various modifications and structural changes may be made therein without departing from the spirit of the invention and within the scope and range of equivalents of the claims. Accordingly, it is appropriate that the appended claims be construed broadly and in a manner consistent with the scope of the invention, as set forth in the following claims.

What is claimed is:

1. A transistor structure for electrostatic discharge protection comprising:
   at least two transistors formed close to each other on a substrate with their gates and sources coupled together and with the drains placed next to each other and separated as a divided drain implant structure, wherein the divided drain implant structure further comprises at least two drain implant regions separated by a lightly doped drain region and a halo implant region formed underneath; and
   two pocket areas for wrapping corners of the lightly doped drain region underneath the gates of the transistors,
   wherein at least one of the drain implant regions is coupled to an input/output pad of a circuit.

2. The structure of claim 1, wherein the halo implant region has a thickness of at least 0.5 µm.

3. The structure of claim 1, wherein all drain implant regions are coupled to the input/output pad.

4. The structure of claim 1, wherein the divided drain implant structure has an odd number of drain implant regions separated by a lightly doped drain region and a halo implant region formed underneath.

5. The structure of claim 4, wherein only a center implant region is coupled to the input/output pad.

6. The structure of claim 1, wherein the transistors are NMOS devices and a parasitic npn transistor is formed by the drain implant region coupled to the input/output pad, the substrate, and the source for propagating electrostatic discharge current.

7. The structure of claim 6, wherein the drain implant regions have N+ implants, the halo implant is of P-type, and the lightly doped drain, structure is of N-type.

8. The structure of claim 7, wherein the transistor devices are PMOS devices, and a parasitic pnp transistor is formed by the drain implant region coupled to the input/output pad, the substrate, and the source for propagating electrostatic discharge current.

9. The structure of claim 8, wherein the drain implant regions have P+ implants, the halo implant is of N-type, and the lightly doped drain structure is of P-type.

10. The structure of claim 1, further comprising gate spacers formed on the sidewalls of the gates of the transistors.

11. A transistor structure for electrostatic discharge protection comprising:
- at least two transistors formed close to each other on a substrate of a first type with their gates and sources coupled together and with the drains placed next to each other and separated as a divided drain implant structure;
- two pocket areas for wrapping corners of the lightly doped drain region underneath the gates of the transistors;
- wherein the divided drain implant structure further comprises at least two drain implant regions doped with a material of a second type that is complementary to the first type, with a lightly doped drain region of the second type and a halo implant region of the first type formed underneath for separating the drain implant regions; and
- wherein at least one of the drain implant regions is coupled to an input/output pad of a circuit.

12. The structure of claim 11, wherein the halo implant region has a thickness of at least 0.5 μm.

13. The structure of claim 11, wherein at least the drain implant regions immediately close to the gates are coupled to the input/output pad.

14. The structure of claim 11, wherein the divided drain implant structure has an odd number of drain implant regions separated by a lightly doped drain region and a halo implant region formed underneath.

15. The structure of claim 14, wherein only a center implant region is coupled to the input/output pad.

16. The structure of claim 11, wherein the transistors are NMOS transistors and the drain implant regions have N+ implants, the halo implant is of P-type, and the lightly doped drain structure is of N-type.

17. The structure of claim 11, wherein the transistors are PMOS transistors, the drain implant regions have P+ implants, the halo implant is of N-type, and the lightly doped drain structure is of P-type.

* * * * *